United States Patent [19]

Hoerning et al.

[11] 4,056,809
[45] Nov. 1, 1977

[54] FAST TABLE LOOKUP APPARATUS FOR READING MEMORY

[75] Inventors: John S. Hoerning; Richard P. Helverson, both of Minneapolis; Darrell E. Nelson, Bloomington, all of Minn.

[73] Assignee: Data Flo Corporation, Minneapolis, Minn.

[21] Appl. No.: 573,303

[22] Filed: Apr. 30, 1975

[51] Int. Cl.$^2$ ............................ G06F 5/02; G06F 9/06
[52] U.S. Cl. ............................ 364/200; 340/347 DD; 364/300
[58] Field of Search ............... 340/172.5, 347 DD; 444/1

[56] References Cited
U.S. PATENT DOCUMENTS

| | | | |
|---|---|---|---|
| 3,656,178 | 4/1972 | DeMaine | 444/1 |
| 3,675,211 | 7/1972 | Raviv | 340/172.5 |
| 3,694,813 | 9/1972 | Loh et al. | 340/172.5 |
| 3,701,108 | 10/1972 | Loh et al. | 340/172.5 |
| 3,717,851 | 2/1973 | Cocke et al. | 340/172.5 |

*Primary Examiner*—Raulfe B. Zache
*Attorney, Agent, or Firm*—Wicks & Nemer

[57] ABSTRACT

Fast Table Lookup Apparatus For Reading Memory is disclosed for use in conjunction with a logic bus, a memory device, a microprocessor of the type which provides an output logic signal to the bus comprising the contents of an internal register and which includes apparatus for immediately reading the logic signals on the bus into the internal register of the microprocessor, including logic which is external to the microprocessor, for recognizing when the microprocessor provides such a logic signal output and for utilizing the register contents available to address a location within the memory device to cause the substitution of the contents of the memory location within the memory device, which conforms to the microprocessor internal register contents, for the contents of the microprocessor internal register on the bus, and all in sufficient time for the memory location contents to be read into the microprocessor as a part of the next input to the microprocessor.

1 Claim, 3 Drawing Figures

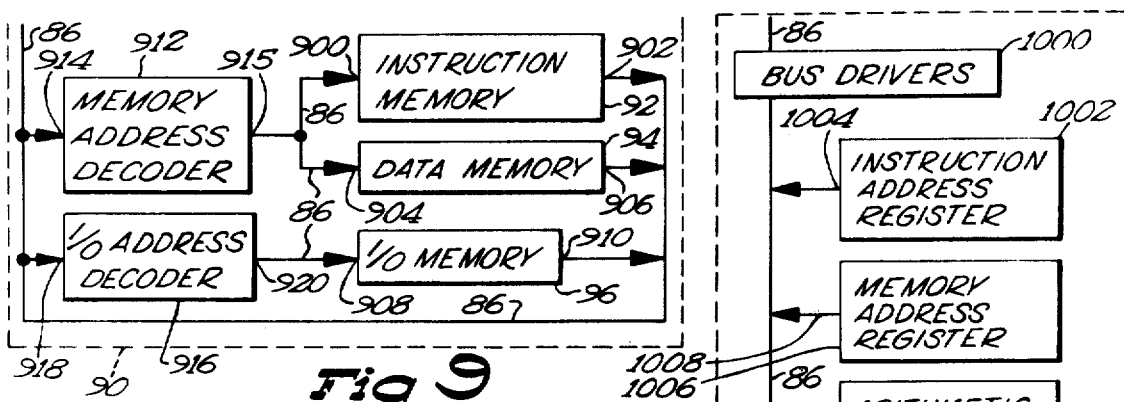
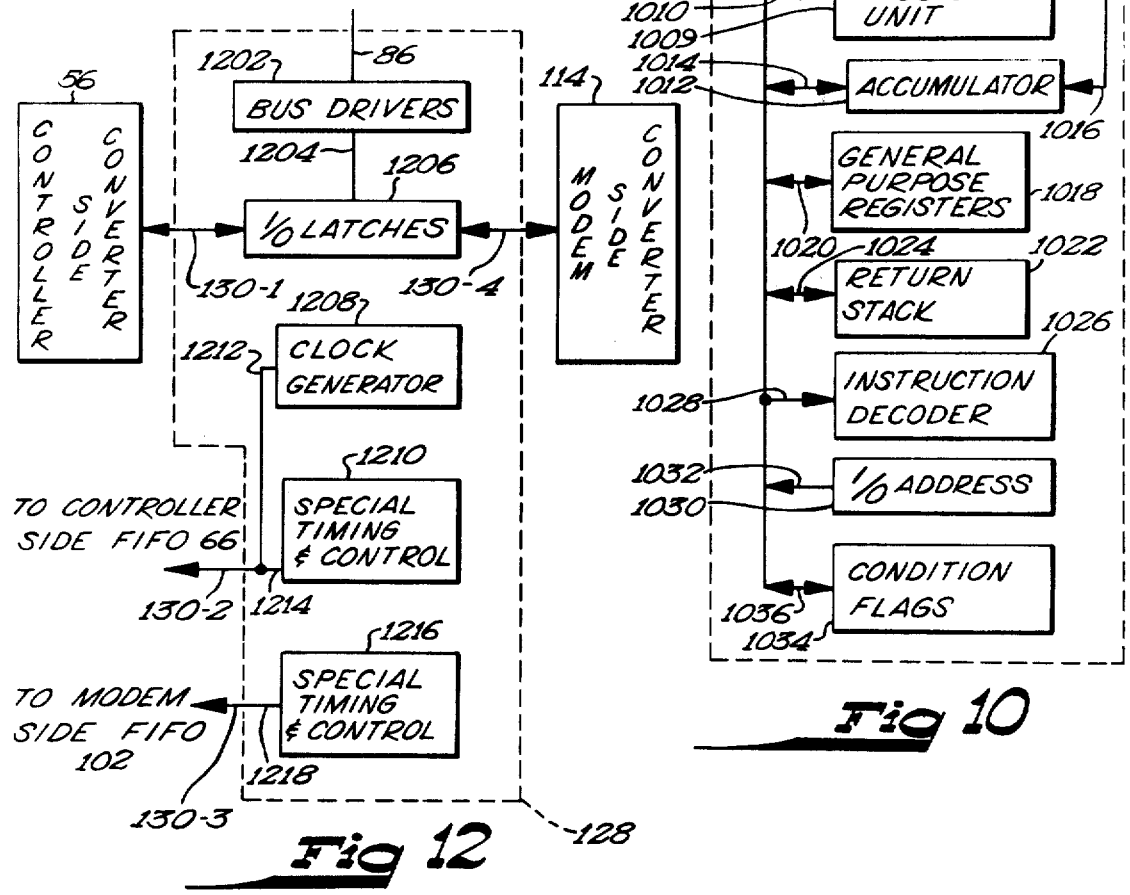

FAST TABLE LOOKUP APPARATUS FOR READING MEMORY

BACKGROUND

For many years, persons and firms in the data processing field have sought apparatus to reduce the time necessary to enter memory, withdraw data, and provide that data to a processor. The present application discloses an invention providing such apparatus.

SUMMARY

Fast table lookup apparatus for reading memory is disclosed which, in the preferred embodiment, operates in conjunction with a logic bus, a memory device, and a microprocessor of the type which provides an output logic signal to the bus comprising the contents of an internal register and which includes apparatus for immediately reading logic signals on the bus into the internal register of the microprocessor. Logic is provided, external to the microprocessor, for recognizing when the microprocessor provides the logic signal output comprising the contents of the internal register and for using the register contents available to address a location within the memory device and for further substituting the contents of the memory location within the memory device, which location conforms to the microprocessor internal register contents, for the microprocessor internal register contents on the bus. All of the above is accomplished in time for the memory location contents to be read into the microprocessor as a part of the next input to the microprocessor.

It is thus an object of the present invention to provide novel and efficient lookup apparatus for reading memory.

It is a further object of the present invention to provide such apparatus for utilization in a fast table lookup apparatus for reading memory.

These and further objects and advantages of the present invention will become clearer in light of the following detailed description of a preferred embodiment of this invention, as described in connection with the drawings for data compaction apparatus as claimed in application Ser. No. 573,571, now U.S. Pat. No. 4,021,732.

DESCRIPTION OF THE DRAWINGS

FIGS. 9, 10, and 12 show block diagrams explaining a preferred embodiment according to and including the present invention.

The remaining FIGS. 1, 2, 3, 4, 5, 6, 7, 8, 11, 13, and 14 to 26 of the drawings of the preferred embodiment according to and including the present invention and the remaining disclosure of the preferred embodiment according to and including the present invention are incorporated herein by reference to application Ser. No. 573,571 filed Apr. 30, 1975 by John S. Hoerning and entitled DATA COMPACTION SYSTEM AND APPARATUS, now U.S. Pat. No. 4,021,782.

What is claimed is:

1. Fast table lookup apparatus for reading memory, comprising in combination: a logic bus; a memory device; a microprocessor of the type which provides an output logic signal to the bus comprising the contents of an internal register and which includes means for immediately reading logic signals on the bus into the internal register of the microprocessor; logic means, external to the microprocessor, for recognizing when the microprocessor provides the logic signal output comprising the contents of the internal register and for using the register contents available to address a location within the memory device and for substituting the contents of the memory location within the memory device, conforming to the microprocessor internal register contents, for the microprocessor internal register contents on the bus in time for the memory location contents to be read into the microprocessor as a part of the next input to the microprocessor; means for providing an electrical connection between the logic bus and the memory device; means for providing an electrical connection between the logic bus and the external logic; means for providing an electrical connection between the external logic and the memory device; means for providing an electrical connection between the logic bus and the microprocessor.

* * * * *